United States Patent
Seo et al.

(10) Patent No.: US 7,417,261 B2
(45) Date of Patent: Aug. 26, 2008

(54) TOP-EMISSION ORGANIC ELECTROLUMINESCENT DISPLAY

(75) Inventors: Chang-Su Seo, Suwon-si (KR); Moon-Hee Park, Busan (KR)

(73) Assignee: Samsung SDI Co., Ltd., Suwon-si (KR)

(*) Notice: Subject to any disclaimer, the term of this patent is extended or adjusted under 35 U.S.C. 154(b) by 182 days.

(21) Appl. No.: 11/101,986

(22) Filed: Apr. 7, 2005

(65) Prior Publication Data
US 2005/0224789 A1   Oct. 13, 2005

(30) Foreign Application Priority Data
Apr. 7, 2004   (KR) .................. 10-2004-0023899

(51) Int. Cl.
*H01L 33/00* (2006.01)
(52) U.S. Cl. .......................... 257/98; 257/89
(58) Field of Classification Search .............. 257/98, 257/89, E33.068; 313/503–506
See application file for complete search history.

(56) References Cited

U.S. PATENT DOCUMENTS

| | | | |
|---|---|---|---|
| 6,222,600 | B1* | 4/2001 | Hirano .................. 349/113 |
| 6,387,600 | B1 | 5/2002 | Hanson |
| 2002/0127793 | A1 | 9/2002 | Murata et al. |
| 2002/0195604 | A1* | 12/2002 | Segawa et al. .............. 257/72 |
| 2003/0234608 | A1 | 12/2003 | Lee et al. |
| 2004/0085497 | A1* | 5/2004 | Kawata .................. 349/111 |
| 2004/0256979 | A1* | 12/2004 | Murakami et al. .......... 313/503 |
| 2005/0116624 | A1* | 6/2005 | Shin ...................... 313/504 |

FOREIGN PATENT DOCUMENTS

| | | |
|---|---|---|
| CN | 1468038 A | 1/2004 |
| JP | 9-134788 | 5/1997 |
| JP | 2003-140191 | 5/2003 |
| JP | 2004-31324 | 1/2004 |
| KR | 10-2004-0000630 | 1/2004 |

OTHER PUBLICATIONS

J.E.A.M. van den Meerakker, et al., "Reductive Corrosion of ITO in Contact with Al in Alkaline Solutions", J. Electrochem, Soc. vol. 139, No. 2, pp. 385-390 (1992).
Chinese Office action dated Jan. 4, 2008 for corresponding Chinese application 200510071655.9, indicating relevance of CN 1468038 and JP 09-134788 listed in this IDS.
Patent Abstracts of Japan, Publication No. 09-134788, dated May 20, 1997, in the name of Mika Yazawa et al.
Patent Abstracts of Japan, Publication No. 2003-140191, dated May 14, 2003, in the name of Shunki Ryu.
Patent Abstracts of Japan, Publication No. 2004-031324, dated Jan. 29, 2004, in the name of Kwanhee Lee et al.

* cited by examiner

*Primary Examiner*—Shouxiang Hu
(74) *Attorney, Agent, or Firm*—Christie, Parker & Hale, LLP

(57) ABSTRACT

A top-emission organic electroluminescent display is disclosed. The top-emission organic electroluminescent display includes a first electrode layer having a reflective layer, a metal-silicide layer and a transparent electrode layer on a substrate; an organic layer including at least one emission layer; and a second electrode layer. The metal-silicide layer is disposed between the reflective layer and the transparent electrode layer to suppress galvanic corrosion caused at an interface of the reflective layer and the transparent electrode layer, and to stabilize a contact resistance between the layers, thereby obtaining uniform brightness in the pixels, and realizing a high quality image.

21 Claims, 7 Drawing Sheets

TOP-EMISSION ORGANIC ELECTROLUMINESCENT DISPLAY

CROSS-REFERENCE TO RELATED APPLICATION

This application claims priority to and the benefit of Korean Patent Application No. 10-2004-0023899, filed Apr. 7, 2004, the entire content of which is enclosed herein by reference.

BACKGROUND OF THE INVENTION

1. Field of the Invention

The present invention relates to a top-emission organic electroluminescent display having a metal-silicide layer at an interface between a reflective layer and a transparent electrode layer to prevent corrosion due to galvanic phenomena and to implement a high quality screen.

2. Description of the Related Art

A galvanic effect refers to a phenomenon that current flows between two adjacent dissimilar metals because of a voltage generated by a potential difference between the metals, thereby producing electricity therein. In the two dissimilar metals coming into electrical contact with each other in this way, one metal having high activity (i.e., with low potential) acts as a positive electrode, and the other metal having relatively low activity (i.e., with high potential) acts as a negative electrode by a difference of work functions at an interface of the dissimilar metals. At this time, when the two metals are exposed to a corrosive solution, the two metals are corroded due to the potential difference between the two metals. This phenomenon is called "Galvanic Corrosion" and, in the galvanic corrosion, the positive electrode having the high activity is rapidly corroded more than when it is used by itself, and the negative electrode having the low activity is corroded at a relatively slow speed.

A typical top-emission organic electroluminescent display includes a reflective electrode with good reflection properties at one side of the display. The reflective electrode is composed of conductive materials having a suitable work function as well as the good reflection properties. However, there is not yet a single suitable material satisfying all of the properties. Accordingly, the reflective electrode is generally made of a multi-layered structure including a reflective layer separately formed and an electrode material layer formed on a top surface of the reflective layer, the electrode material layer having conductivity different from that of the reflective layer. Therefore, when the typical top-emission organic electroluminescent display has the multi-layered structure, the galvanic corrosion phenomenon at the interface of the dissimilar metals cannot be ignored.

By way of example, FIG. 1 shows a partial cross-sectional view of a conventional top-emission organic electroluminescent display. Referring to FIG. 1, the top-emission organic electroluminescent display has a structure in which a reflective layer 110a and a transparent electrode layer 110b, which are used as a first electrode layer 110, are sequentially stacked on a substrate 100, and an organic layer 130 and a second electrode layer 140 are sequentially formed on the transparent electrode layer 110b.

In the top-emission organic electroluminescent display having this structure, the reflective layer 110a is uniformly formed by a method such as sputtering or vacuum deposition of high-reflectivity metal materials. Conventionally, an active metal such as aluminum or aluminum alloy has been used as the reflective layer.

Subsequently, the transparent electrode layer 110b is formed by depositing a transparent electrode material on the reflective layer 110a, such that a light incident from the outside is reflected by the reflective layer 110a, and then the transparent electrode layer 110b is patterned to form the first electrode layer 110. In this process, indium tin oxide (ITO) or indium zinc oxide (IZO) is used as the transparent electrode material.

Finally, the top-emission organic electroluminescent display is completed by forming a pixel defining layer 120 which defines a pixel region, at both sides of the first electrode layer 110, and by forming the organic layer 130 having an emission layer and the charge (electron and hole) transporting capability, and the second electrode layer 140 on the pixel defining layer 120.

In the processes of fabricating the electroluminescent display as described above, patterning the first electrode layer 110 is typically performed by successive photolithography and etching processes. In detail, patterning the first electrode layer 110 includes forming a photoresist pattern on the transparent electrode layer 110b, performing a typical exposure and development process of the photoresist pattern, and sequentially etching the transparent electrode layer 110b and the reflective layer 110a using the photoresist pattern as a mask.

For example, typical wet or dry etching may be used as the above etching process. In case of the wet etching, a desired pattern is obtained by applying or spraying strong acid solutions such as HF, $HNO_3$, $H_2SO_4$ to a region to be etched. Also, the strong acid chemical materials and strong base chemical materials such as $HNO_3$, HCl, $H_3PO_4$, $H_2O_2$, and $NH_4OH$ are used for cleaning and strip processes after the etching process.

The strong acid chemical materials and the strong base chemical materials, which are used in the etching, cleaning and strip processes, are directly contacted to the transparent electrode layer 110b and the reflective layer 110a used as the first electrode layer 110. Accordingly, as shown in FIG. 2, the galvanic corrosion phenomenon occurs at the interface of the transparent electrode layer 110b and the reflective layer 110a [J. E. A. M. van den Meerakker and W. R. ter Veen, *J. Electrochem, Soc.*, vol. 139, no. 2, 385(1992)]. In particular, considering that a metal such as aluminum and alloys thereof used as the reflective layer is rapidly corroded and is likely to form a metal oxide layer 110c such as, for example, $Al_2O_3$, even when it is exposed to the air for a short time, there are serious problems that the metal oxide layer 110c is generated through the galvanic corrosion phenomenon. In particular, when the chemical material partially remains at the interface between the transparent electrode layer 110b and the reflective layer 110a, the corrosion through the galvanic corrosion phenomenon is accelerated, and a crevice corrosion in which the corrosion proceeds at certain areas occurs.

Such a galvanic corrosion phenomenon is propagated along the interface between the transparent electrode layer 110b and the reflective layer 110a. Therefore, contact resistance between the layers is rapidly increased, and very unstable resistance distribution is created. As a result, in the conventional top-emission organic electroluminescent display, a brightness non-uniformity is generated in which some pixels appear brighter while other pixels appear darker when the display is turned on, which leads to the degradation of display quality.

To solve such a galvanic corrosion problem, U.S. Pat. No. 6,387,600 assigned to Micron Technology, Inc. discloses a method for preventing the galvanic corrosion at the interface of aluminum and ITO made of a transparent electrode material. Specifically, the patent discloses a method of forming a passivation layer such as chromium, chrome alloys, nickel, or cobalt stacked on an aluminum layer, to prevent corrosion caused by chemical materials in a photolithography process, an etching process and a patterning process. However, the passivation layer used in the above patent is removed by an etching process after the patterning process is completed. In this etching process, a mixed etchant of ceric ammonium nitrate and acetic acid is used, and therefore, the galvanic corrosion may take place again.

In view of the above, a clear solution to suppress the galvanic corrosion on the aluminum reflective layer of the top-emission organic electroluminescent display is still needed.

SUMMARY OF THE INVENTION

One exemplary embodiment of the present invention, therefore, solves aforementioned problems associated with conventional devices by providing a top-emission organic electroluminescent display, of which galvanic corrosion phenomenon at an interface of a transparent electrode material and a metal material can be suppressed, and a method of fabricating the same.

One exemplary embodiment of the present invention provides a top-emission organic electroluminescent display, of which a contact resistance of a transparent electrode layer and a metal reflective layer is uniformly generated, and a method of fabricating the same.

One exemplary embodiment of the present invention provides a top-emission organic electroluminescent display with uniform brightness and a method of fabricating the same.

One exemplary embodiment of the present invention provides a top-emission organic electroluminescent display, of which a metal-silicide layer is formed between a transparent electrode layer and a reflective layer, and a method of fabricating the same.

One exemplary embodiment of the present invention provides a top-emission organic electroluminescent display, in which a high quality image may be obtained, and a method of fabricating the same.

In an exemplary embodiment of the present invention, a top-emission organic electroluminescent display includes: a substrate; a first electrode layer formed on the substrate and having a reflective layer, a metal-silicide layer and a transparent electrode layer; an organic layer formed on the first electrode layer and having at least one emission layer; and a second electrode layer formed on the organic layer.

The metal-silicide layer may be placed between the reflective layer and the transparent electrode layer to suppress the oxidation of the reflective layer, thereby stabilizing a contact resistance between the layers.

In another exemplary embodiment of the present invention, a method of fabricating an organic electroluminescent display includes: forming a reflective layer on a substrate; forming a metal-silicide layer on the reflective layer; forming a transparent electrode layer on the metal-silicide layer; patterning the transparent electrode layer to form a first electrode layer; forming a pixel defining layer at both edges of the first electrode layer to define a pixel region; forming an organic layer including at least one emission layer on an entire surface of the substrate; and forming a second electrode layer on the organic layer.

The metal-silicide layer may be formed by sputtering and thermally treating a metallic material and α-Si, in-situ.

In yet another exemplary embodiment of the present invention, an organic electroluminescent display is provided. The organic electroluminescent display includes a substrate, a first electrode layer formed on the substrate, an emission layer formed on the first electrode layer, and a second electrode layer formed on the emission layer. The first electrode layer includes a reflective layer, a transparent electrode layer, and a suppression layer. The suppression layer is disposed between the reflective layer and the transparent electrode layer, and suppresses oxidation of the reflective layer.

BRIEF DESCRIPTION OF THE DRAWINGS

The above and other features of the present invention will be described in reference to certain exemplary embodiments thereof with reference to the attached drawings in which.

DETAILED DESCRIPTION

FIGS. 3A to 3F are partial cross-sectional views that illustrate a method of fabricating a top-emission organic electroluminescent display in accordance with an exemplary embodiment of the present invention.

Figure 1:
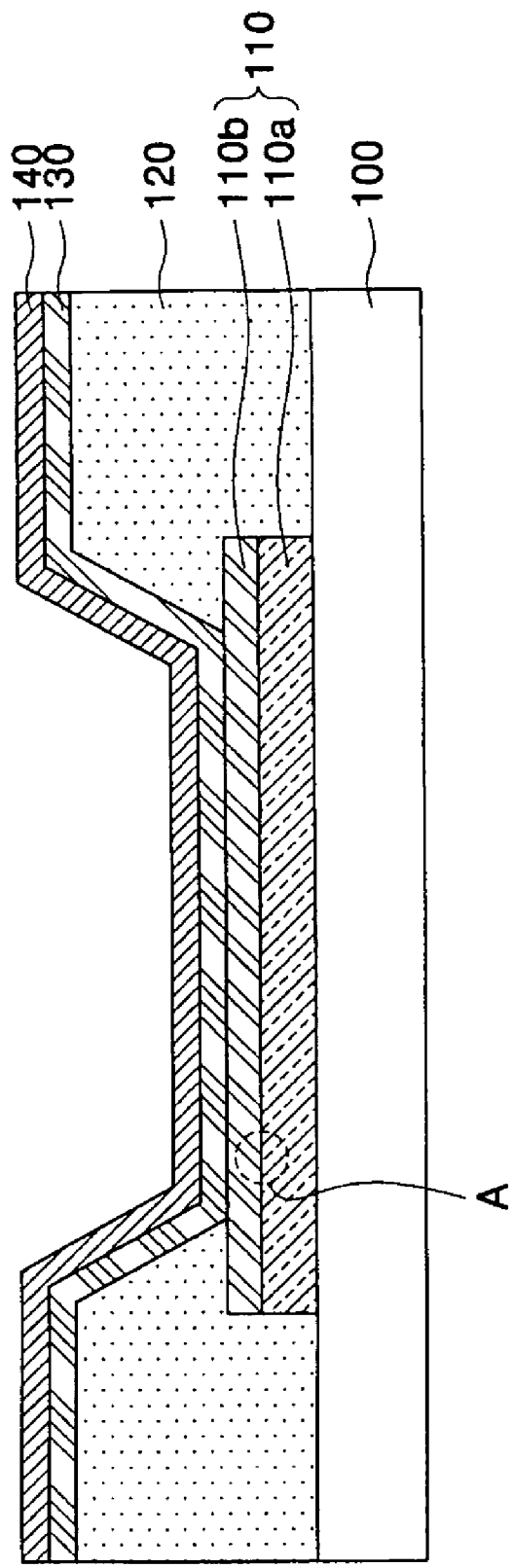
FIG. 1 is a partial cross-sectional view illustrating a conventional top-emission organic electroluminescent display which has a reflective layer and a transparent electrode layer as a first electrode layer.
Figure 2:
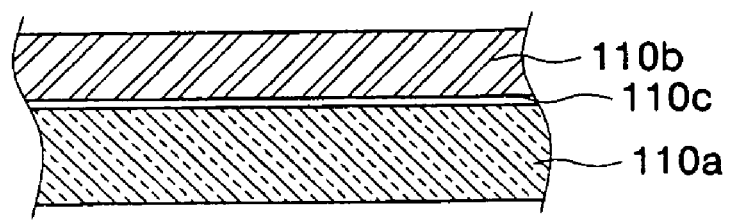
FIG. 2 is a cross-sectional view in which a portion A of FIG. 1 is enlarged, to show a metal oxide layer formed at an interface of the reflective layer and the transparent electrode layer in FIG. 1.
Figure 3A:
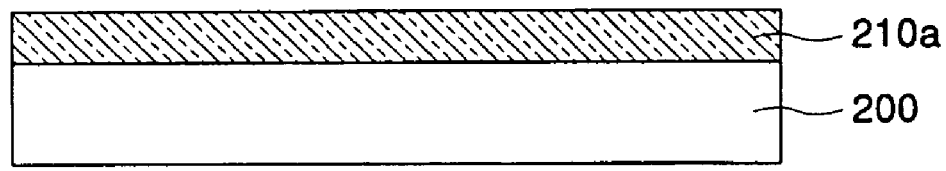
FIGS. 3A to 3F are partial cross-sectional views that illustrate a method of fabricating a top-emission organic electroluminescent display according to an exemplary embodiment of the present invention.

Referring to FIG. 3A, a reflective layer 210a made of a metal material having high reflective efficiency is first formed on a substrate 200.

The substrate 200 is made of conventional substrate material such as glass, plastic, metal, or the like. For example, the glass substrate is used as the substrate in one exemplary embodiment.

The reflective layer 210a is made of a material having high reflection properties to reflect incident light. A suitable material for making the reflective layer 210a can be one of aluminum (Al), aluminum alloys, chromium, silver (Ag), molybdenum (Mo), molly tungsten (MoW), titanium (Ti) and nickel (Ni), or alloys thereof. In one exemplary embodiment, aluminum-neodymium (Al—Nd) having the high reflection properties is used. The reflective layer 210a can be formed by a typical method such as RF sputtering, DC sputtering, ion-beam sputtering or vacuum deposition, and should be formed to have a thickness of at least 300 Å to show suitable reflection properties.

Figure 3B:
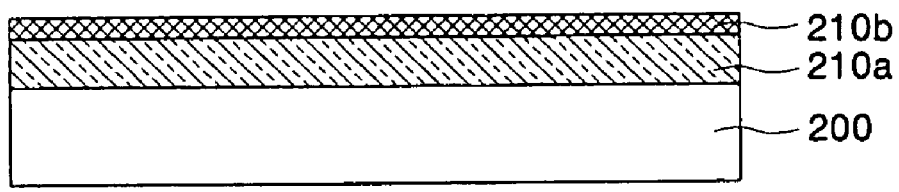

Referring to FIG. 3B, after forming the reflective layer 210a, a metal-silicide layer 210b is formed on the reflective layer 210a.

By way of example, the metal-silicide layer 210b can be formed by sputtering a metal material and amorphous silicon (α-Si) under the vacuum atmosphere in-situ, and thermally treating it at the temperature of 150 to 400° C. to form a metal-Si bond. The metal material used to form the metal-silicide layer 210b, for example, may be one of the metal materials listed above for the reflective layer 210a. As described above, there is a problem that because aluminum or aluminum alloy used as the reflective layer 210a is a metal material having high activity, a metal oxide layer is formed on its surface when it is exposed to air even for a short time, and therefore interface properties of the electrode are dramatically degraded. This problem is solved by forming the metal-silicide layer 210b having low activity on the reflective layer 210a. Additionally, the metal-silicide layer 210b acts to prevent the reflective layer 210a and a subsequent transparent electrode layer 210c, of which a work function difference is large, from directly contacting each other, thereby suppressing the deterioration of the interface properties and enhancing the reflection properties of the first electrode layer 210.

When the reflective layer 210a is made of aluminum or aluminum alloy, the material used as the reflective layer 210a bonds with the α-Si to create an Al—Si bond. At this time, a bond ratio of Al to Si is at least 1:1.

Further, in case of employing aluminum-neodymium (Al—Nd) as the material, the Al—Nd bonds with the α-Si to create an Al—Si or Al—Nd—Si bond. At this time, the bond ratio of Al to Si is at least 1:1.

The metal-silicide layer 210b in the present invention is enough to ensure the movement of charges between the reflective layer 210a and the transparent electrode layer 210c, and should have a thickness of about 20 to 150 Å to prevent the metal oxide layer from forming on the reflective layer 210a.

Figure 3C:
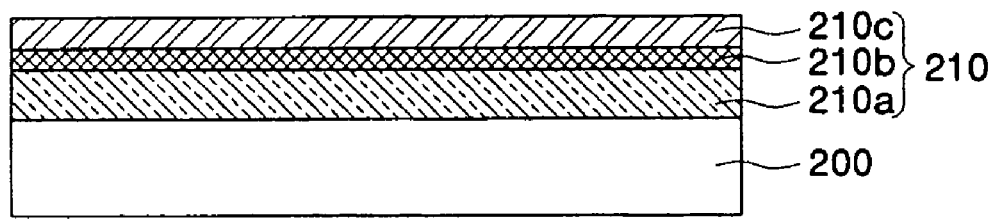

Referring to FIG. 3C, the transparent electrode layer 210c is formed by depositing a transparent electrode material on the metal-silicide layer 210b. The transparent electrode layer 210c is made of a conductive material having a work function higher than that of the reflective layer 210a. By way of example, the material used should be indium tin oxide (ITO) or indium zinc oxide (IZO) in one exemplary embodiment. The transparent electrode layer 210c is formed by conventional sputtering or vacuum deposition to have a thickness of about 20 to 300 Å.

Figure 3D:
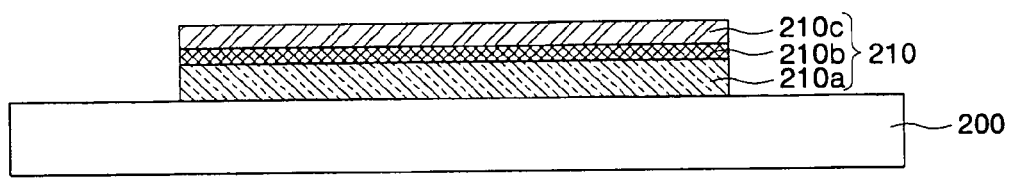

Referring to FIG. 3D, the first electrode layer 210 is made by forming a photoresist pattern on the transparent electrode layer 210c, and performing a photolithography process including conventional baking, exposure and development processes, and an etching process. At this time, the etching process uses one of dry etching and wet etching, and the etching process is continued until the transparent electrode layer 210c, the metal-silicide layer 210b and the reflective layer 210a are etched. After the etching process is completed, the first electrode layer 210 including the patterned reflective layer 210a, metal-silicide layer 210b and transparent electrode layer 210c is formed by removing the photoresist pattern used in previous processes with a strip solution or the like.

By way of example, when the wet etching is used as the etching process, even when the reflective layer 210a and the transparent electrode layer 210c are concurrently exposed to a strong acid material, the galvanic corrosion and the crevice corrosion at the interface of the layers 210a and 210c can be suppressed because the layers 210a and 210c are not in contact with each other. This may also be applied in the strip process for removing the photoresist. As a result, the first electrode layer 210 having a substantially stable contact resistance can be formed.

Figure 3E:
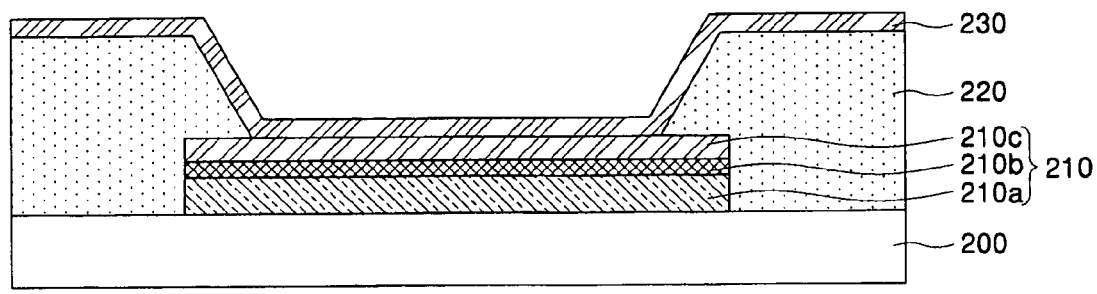

Referring to FIG. 3E, a pixel defining layer 220 is formed on the first electrode layer 210 to define an emission region of the top-emission organic electroluminescent display. The emission region is made by forming the pixel defining layer 220 on the first electrode layer 210, and then etching a predetermined region of the first electrode layer 210 to be exposed to form an opening (not shown). In this process, the pixel defining layer 220 is typically formed using benzocyclobutene (BCB), acryl-based photoresist, phenol-based photoresist or polyimide-based photoresist.

Next, an organic layer 230 including at least one emission layer is formed on the first electrode layer 210 over an entire surface of the substrate 200. The emission layer emits light at a particular wavelength according to a recombination theory of electrons and holes injected from a cathode and an anode of the top-emission organic electroluminescent display. In addition, to obtain high luminous efficiency, a hole injection layer, a hole transport layer, a hole blocking layer, an electron transport layer and an electron injection layer, all of which have the charge transporting capability, are selectively interposed between each electrode and the emission layer. In the top-emission organic electroluminescent display of the present invention, when the first electrode layer 210 serves as an anode electrode, a second electrode layer 240 (shown in FIG. 3F) serves as a cathode electrode. The hole injection layer and the hole transport layer of the additionally interposed organic layers should be placed between the first electrode layer 210 and the emission layer 230, and the hole blocking layer, the electron transport layer and the electron injection layer should be placed between the emission layer 230 and the second electrode layer 240. Forming the organic layer 230 including such an emission layer is performed by a wet coating method such as spin coating, dip coating, a spraying method, a screen printing method and an inkjet printing method, which are applied in a solution state, or a dry coating method such as sputtering and vacuum deposition.

Figure 3F:
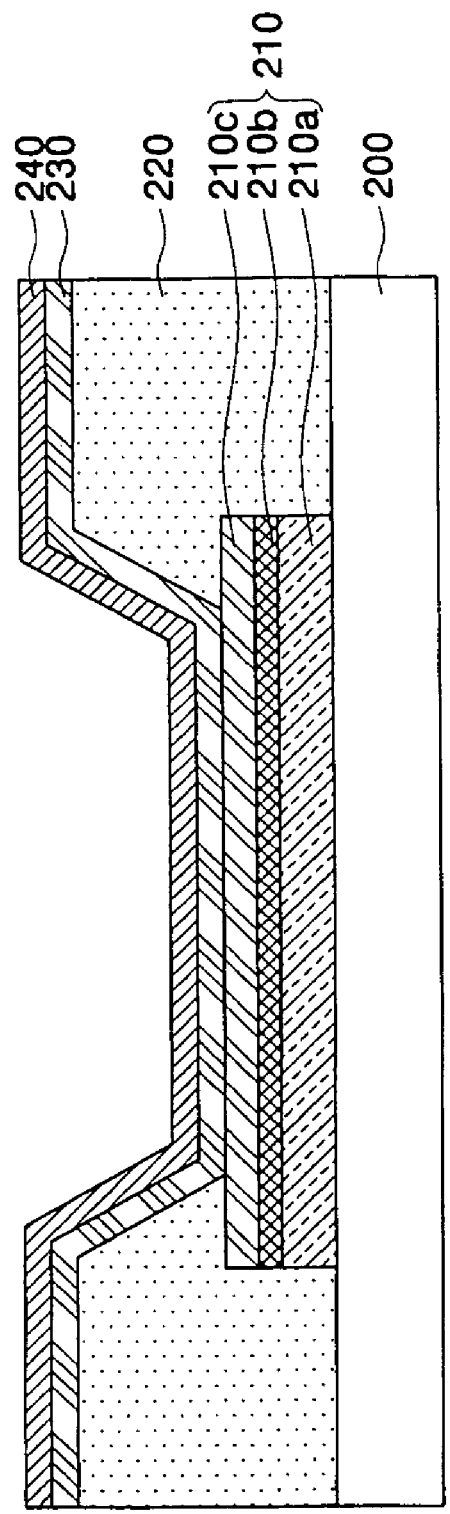

Referring to FIG. 3F, the second electrode layer 240 is formed on the organic layer 230. The second electrode layer should be made of a transparent electrode material such as ITO or IZO, or Mg, Ca, Al, Ag, Ba or alloys thereof, to have a thickness enough to transmit the light.

Finally, the top-emission organic electroluminescent display, in which the substrate 200, the first electrode layer 210, the organic layer 230 and the second electrode layer 240 are sequentially stacked according to the above processes, is encapsulated using a typical encapsulation method. By way of example, the encapsulation method includes encapsulating with an insulating substrate such as a metal can and barium oxide, or encapsulating with an insulating polymer to form a passivation layer.

When the top-emission organic electroluminescent display obtained through the above processes is driven, light is emitted from the emission layer. The emitted light goes out through the second electrode layer 240, or goes out through the second electrode layer 240 after it is reflected from the reflective layer 210a of the first electrode layer 210. At this time, the metal-silicide layer 210b formed on the reflective layer 210a can stabilize and improve the contact resistance, and enhance the brightness of the top-emission organic electroluminescent display, as well as obtaining uniform brightness in the pixels, thereby realizing a high quality image.

Heretofore, the present invention was described in relation to the simple-structural top-emission organic electroluminescent display including the substrate, the first electrode layer, the organic layer having the emission layer, and the second electrode layer. However, the structure according to the present invention may also be applied to an active-matrix organic electroluminescent display including a thin film transistor, and a passive-matrix organic electroluminescent display which has no thin film transistor.

Hereinafter, the organic electroluminescent display in exemplary embodiments according to the present invention will be described using the following example, and the following example is presented only by way of illustration for the present invention, and is not intended to limit the scope of the present invention.

EXAMPLE

To fabricate a top-emission organic electroluminescent display according to the exemplary embodiment of the present invention, after sputtering of Al and Nd was performed onto a glass substrate to form an Al—Nd reflective layer having a thickness of about 1000 Å, sputtering of Al and α-Si was continuously performed at a temperature of about 200° C. to form an aluminum-silicide layer having a thickness of about 150 Å. Next, ITO as a transparent electrode material was vacuum deposited to a thickness of about 125 Å on the aluminum-silicide layer to form a transparent electrode layer.

Subsequently, in order to form the patterned first electrode layer, acryl-based photoresist was applied on the transparent electrode layer, and subjected to a photolithography process including exposure and development processes. The transparent electrode layer, and then the aluminum-silicide layer and the reflective layer were sequentially etched.

Next, after forming a pixel defining layer on the first electrode layer, the photolithography process was performed in the same way to pattern the pixel defining layer to have an opening in a predetermined region.

Next, a hole transport layer having a thickness of about 500 Å was formed by vacuum deposition on the first electrode layer over an entire surface of the substrate, and then an emission layer having a thickness of about 250 Å, an electron transport layer having a thickness of about 450 Å, and LiF as an electron injection layer having a thickness of about 3 Å were formed under the same conditions.

Next, a second electrode layer was formed by vacuum deposition of MgAg onto the electron injection layer to have a thickness of about 100 Å, and then it was encapsulated by a metal can to complete the organic electroluminescent display.

COMPARATIVE EXAMPLE

In order to compare an effect of forming the aluminum-silicide layer according to the described embodiment of the present invention, a top-emission organic electroluminescent display was formed by the same process as used in the above example, except that there was no aluminum-silicide layer between the reflective layer and the transparent electrode layer.

Embodiment

The contact resistance and the surface state of the top-emission organic electroluminescent displays, which were obtained from the above example and the comparative example, were measured by a microscope, and the measured result is shown in FIGS. 4 to 7.

Figure 4:
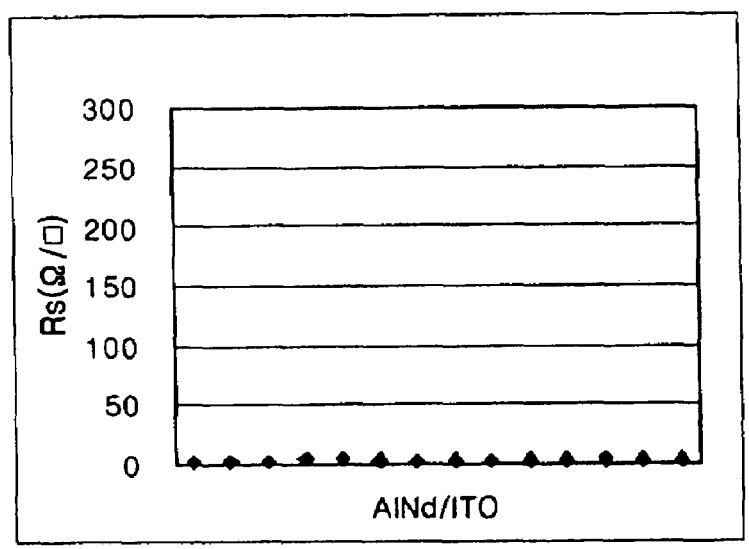
FIG. 4 is a graph which illustrates that contact resistance of a first electrode layer in an exemplary embodiment according to the present invention is stabilized.
Figure 5:
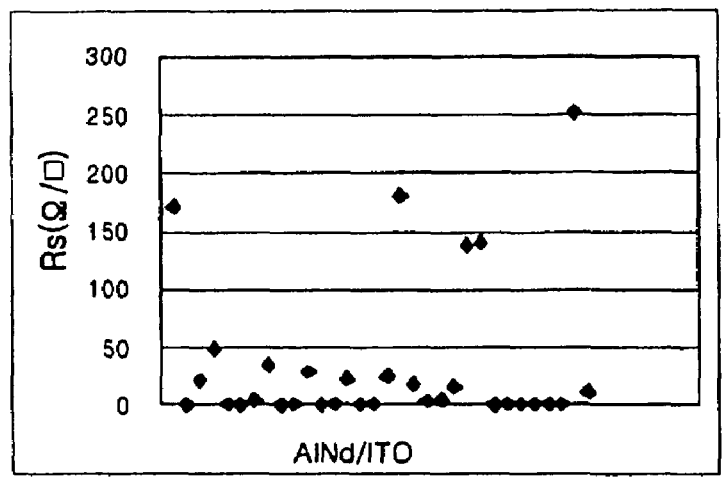
FIG. 5 is a graph which illustrates that contact resistance of a first electrode layer in a comparative example according to prior art is unstabilized.

FIG. 4 is a graph illustrating a contact resistance measured at the Al—Si/ITO interface of the first electrode layer of the top-emission organic electroluminescent display obtained from the above example, and FIG. 5 is a graph illustrating a contact resistance measured at the AlNd/ITO interface of the top-emission organic electroluminescent display obtained from the above comparative example.

Referring to FIG. 4, resistance values measured in any regions of the first electrode layer are approximately equal, thereby showing that the contact resistance between the reflective layer and the transparent electrode layer is very stable. On the other hand, in FIG. 5, the measured resistance values are unevenly distributed, thereby showing that the contact resistance between the layers is very unstable. A reason for such unstable contact resistance is that an $Al_2O_3$ oxide layer is formed by the galvanic effect at an interface of Al—Nd used as the reflective layer and ITO.

Figure 6:
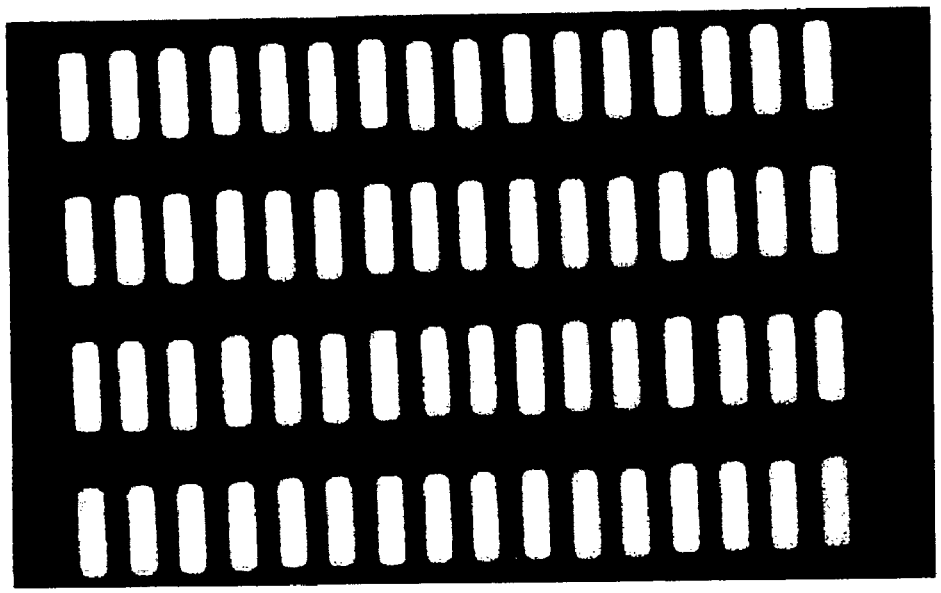
FIG. 6 is a photograph showing that brightness of each pixel in a top-emission organic electroluminescent display obtained in an example according to the present invention is uniform.
Figure 7:
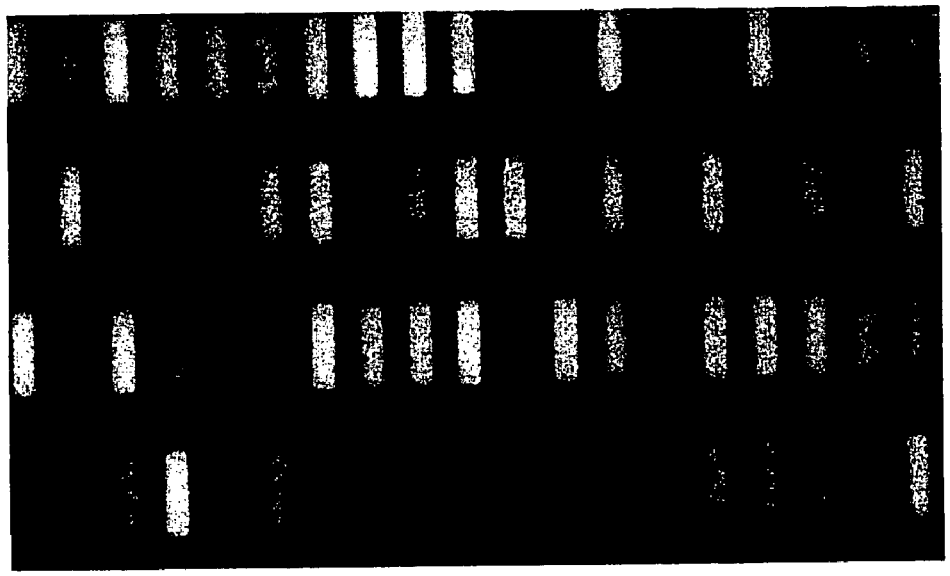
FIG. 7 is a photograph showing that brightness of each pixel in a top-emission organic electroluminescent display obtained in a comparative example according to prior art is uneven.

The contact resistance of FIGS. 4 and 5 directly affects the brightness of the top-emission organic electroluminescent display, and this can be seen in FIGS. 6 and 7.

FIG. 6 is a photograph showing surface states of the pixels of the top-emission organic electroluminescent display obtained from the above example, and FIG. 7 is a photograph showing surface states of the pixels of the top-emission organic electroluminescent display obtained from the above comparative example.

Referring to FIG. 6, it can be appreciated that the top-emission organic electroluminescent display according to the above example has a substantially uniform contact resistance between the reflective layer and the transparent electrode layer, and therefore the pixels have substantially uniform brightness.

Referring to FIG. 7, it can be appreciated that the brightness of the pixels are non-uniform by coexistence of the pixels having high brightness and the pixels having low brightness, and the whole brightness is lower than that in FIG. 6. The reason seems that the metal oxide film is formed by the galvanic corrosion phenomenon at the interface of the reflective layer and the transparent electrode layer constituting the first electrode layer, and the corroded portion has spread along the interface.

Through this comparison, it can be appreciated that forming the aluminum-silicide layer between the reflective layer and the transparent electrode layer of the first electrode layer according to the present invention may remove problems such as non-uniformity of pixel brightness shown in FIG. 7.

As described above, the described embodiment of the present invention is capable of suppressing the galvanic phenomenon and formation of the metal oxide layer at the interface of the reflective layer and the transparent electrode layer used as the first electrode layer, by forming the metal-silicide layer between the reflective layer and the transparent electrode layer.

As a result, the top-emission organic electroluminescent display according to the described embodiment of the present invention is capable of obtaining the uniformity of pixel brightness to thereby implement the high quality image.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic electroluminescent display, comprising:
   a substrate;

a first electrode layer on the substrate and comprising a reflective layer comprising aluminum (Al), a metal-silicide layer comprising Al and a transparent electrode layer;

an organic layer on the first electrode layer and comprising at least one emission layer; and a second electrode layer on the organic layer, wherein the metal-silicide layer has a thickness of about 20 to 150 Å.

2. The organic electroluminescent display of claim 1, wherein the substrate comprises a material selected from a group consisting of glass, plastic and metal.

3. The organic electroluminescent display of claim 1, wherein the first electrode layer is an anode and the second electrode layer is a cathode.

4. The organic electroluminescent display of claim 1, wherein the reflective layer consists of Al.

5. The organic electroluminescent display of claim 1, wherein the reflective layer consists of aluminum-neodymium (Al—Nd).

6. The organic electroluminescent display of claim 5, wherein the metal-silicide layer consists of silicon and Al—Nd.

7. The organic electroluminescent display of claim 5, wherein the metal-silicide layer consists of silicon and Al.

8. The organic electroluminescent display of claim 4, wherein the metal-silicide layer consists of silicon and Al.

9. The organic electroluminescent display of claim 1, wherein the metal-silicide layer is made of silicon and a material selected from a group consisting of Al, and aluminum alloy.

10. The organic electroluminescent display of claim 9, wherein the metal-silicide layer is made of silicon and aluminum-neodymium (Al—Nd).

11. The organic electroluminescent display of claim 1, wherein the transparent electrode layer is made of Indium Tin Oxide (ITO) or Indium Zinc Oxide (IZO).

12. The organic electroluminescent display of claim 1, wherein the organic layer further comprises at least one layer selected from a group consisting of a hole injection layer, a hole transport layer, a hole blocking layer, an electron transport layer, and an electron injection layer, each of the layers having charge transporting capability.

13. The organic electroluminescent display of claim 1, wherein the second electrode layer is made of one metal selected from a group consisting of ITO, IZO, Mg, Ca, Al, Ag, Ba, and an alloy thereof.

14. An organic electroluminescent display, comprising:
a substrate;
a first electrode layer on the substrate and comprising a reflective layer comprising aluminum (Al), a transparent electrode layer, and a suppression layer disposed between the reflective layer and the transparent electrode layer, wherein the suppression layer suppresses oxidation of the reflective layer;

an emission layer on the first electrode layer; and
a second electrode layer on the emission layer,
wherein the suppression layer comprises a metal-silicide layer comprising Al and having a thickness of about 20 to 150 Å.

15. The organic electroluminescent display of claim 14, wherein the suppression layer substantially prevents a direct contact between the reflective layer and the transparent electrode layer.

16. The organic electroluminescent display of claim 14, wherein the reflective layer consists of Al, and wherein the metal-silicide layer consists of silicon and Al.

17. The organic electroluminescent display of claim 14, wherein the suppression layer is made of silicon and a material selected from Al, aluminum alloy, and aluminum-neodyium (Al—Nd).

18. The organic electroluminescent display of claim 14, wherein the transparent electrode layer is made of Indium Tin Oxide (ITO) or Indium Zinc Oxide (IZO).

19. The organic electroluminescent display of claim 14, wherein the reflective layer consists of aluminum-neodymium (Al—Nd), and wherein the metal-silicide layer consists of silicon and Al—Nd.

20. The organic electroluminescent display of claim 14, wherein the reflective layer consists of aluminum-neodymium (Al—Nd), and wherein the metal-silicide layer consists of silicon and Al.

21. An organic electroluminescent display for displaying a light, comprising:
a substrate;
a reflective electrode layer on the substrate and comprising a aluminum reflective layer, a first transparent electrode layer, and a metal-silicide layer comprising aluminum, the metal-silicide layer being between the aluminum reflective layer and the first transparent electrode layer;
an organic layer on the first electrode layer and comprising at least one emission layer for emitting the light; and
a second transparent electrode layer on the organic layer,
wherein the metal-silicide layer is adapted to ensure movement of charges between the aluminum reflective layer and the first transparent electrode layer and has a thickness of about 20 to 150 Å, and
wherein the reflective electrode layer is adapted to reflect the light emitted by the at least one emission layer from the aluminum reflective layer to go through the second transparent electrode layer.

* * * * *

UNITED STATES PATENT AND TRADEMARK OFFICE
CERTIFICATE OF CORRECTION

PATENT NO. : 7,417,261 B2  Page 1 of 1
APPLICATION NO. : 11/101986
DATED : August 26, 2008
INVENTOR(S) : Chang-Su Seo It is certified that error appears in the above-identified patent and that said Letters Patent is hereby corrected as shown below:

Column 10, line 20, Claim 17    Delete "neodyium",
                                Insert --neodymium--

Column 10, line 36, Claim 21    Delete "a aluminum",
                                Insert --an aluminum--

Signed and Sealed this

Twenty-fourth Day of March, 2009

JOHN DOLL
*Acting Director of the United States Patent and Trademark Office*